US006313636B1

(12) United States Patent
Pohl et al.

(10) Patent No.: US 6,313,636 B1
(45) **Date of Patent: *Nov. 6, 2001**

(54) METHOD FOR DETERMINING SWITCHGEAR-SPECIFIC DATA AT CONTACTS IN SWITCHGEAR AND/OR OPERATION-SPECIFIC DATA IN A NETWORK CONNECTED TO THE SWITCHGEAR AND APPARATUS FOR CARRYING OUT THE METHOD

(75) Inventors: Fritz Pohl, Hemhofen; Norbert Elsner, Bubenreuth, both of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

This patent is subject to a terminal disclaimer.

(21) Appl. No.: 09/499,854

(22) Filed: Feb. 7, 2000

Related U.S. Application Data

(63) Continuation of application No. PCT/DE98/02247, filed on Aug. 5, 1998.

(30) Foreign Application Priority Data

Aug. 7, 1997 (DE) ............................................. 197 34 224

(51) Int. Cl.[7] .................................................... G01R 31/02

(52) U.S. Cl. ............................ 324/421; 324/536; 361/85; 361/88

(58) Field of Search .................................... 324/415, 418, 324/421, 423, 535, 71.1, 71.2; 307/137, 138; 361/85, 88, 115

(56) References Cited

U.S. PATENT DOCUMENTS 5,270,900 * 12/1993 Alden et al. ......................... 361/153
5,629,869 * 5/1997 Johnson et al. ........................ 702/34

FOREIGN PATENT DOCUMENTS

4028721A1 3/1992 (DE) .
4427006A1 2/1996 (DE) .
19603310A1 8/1997 (DE) .
4408631C2 11/1998 (DE) .
0193732A1 2/1985 (EP) .
0694937A2 1/1996 (EP) .

* cited by examiner

*Primary Examiner*—Safet Metjahic
*Assistant Examiner*—Vincent Q. Nguyen
(74) *Attorney, Agent, or Firm*—Herbert L. Lerner; Laurence A. Greenberg; Werner H. Stemer

(57) ABSTRACT

A method for determining switchgear-specific data at contacts in switchgear and/or operation-specific data in a network connected to the switchgear includes detecting a so-called contact follow-through travel at a switching path as an equivalent criterion for an erosion of contacts, particularly for contactor contacts. A resilience change during a shutdown cycle is measured, can be used to determine the erosion and can be converted into a remaining contact life for the contacts. Accurate measurement of the armature movement from a start of the armature movement to a start of contact opening is required for that purpose. Switching states of a switching device and of the electrical network are additionally detected from signals for resilience detection. An apparatus for carrying out the method is also provided.

23 Claims, 5 Drawing Sheets

METHOD FOR DETERMINING SWITCHGEAR-SPECIFIC DATA AT CONTACTS IN SWITCHGEAR AND/OR OPERATION-SPECIFIC DATA IN A NETWORK CONNECTED TO THE SWITCHGEAR AND APPARATUS FOR CARRYING OUT THE METHOD

CROSS-REFERENCE TO RELATED APPLICATION

This application is a continuation of copending International Application No. PCT/DE98/02247, filed Aug. 5, 1998, which designated the United States.

BACKGROUND OF THE INVENTION

1. Field of the Invention

The invention relates to a method for determining switchgear-specific data at contacts in switchgear, in particular contactor contacts, and/or for determining operation-specific data in a network connected to the switchgear or contactors, in which a so-called contact follow-through travel at a switching path is detected as an equivalent criterion for erosion, and a resilience change during a shutdown cycle is measured in each case to determine an erosion of contact facings of contact pieces and is converted to a remaining service life, for which purpose a time measurement of an armature movement from a start of the armature movement to a start of contact opening is carried out for a switchgear drive having an armature, a magnet coil and an associated yoke, wherein the armature movement is determined from the measured time, the resilience is determined therefrom, the measurement of the contact opening is detected on a load side of the monitored switching device and the armature movement start is signaled from the voltage of the magnet coil. The invention also relates to an associated apparatus for carrying out the method.

German Published, Non-Prosecuted Patent Applications DE 44 27 006 A1, DE 196 03 310 A1 and DE 196 03 319 A1 describe methods for determining a remaining contact life of contactors, in which contact wear, that increases over the course of the electrical contact life, is detected from a time difference between a start of the armature opening movement and a start of contact opening. A present value of the so-called contact follow-through travel is determined in that case with the aid of a microprocessor and specifically adapted electronic circuits for detecting required measurement variables, and reduces as a result of erosion from its new value (=100% remaining contact life) to its minimum contact life (=0% remaining contact life). The contact follow-through travel is defined as that movement distance through which the magnet armature travels between the start of armature opening and the start of contact opening during the shutdown cycle.

SUMMARY OF THE INVENTION

It is accordingly an object of the invention to provide a method for determining switchgear-specific data at contacts in switchgear and/or operation-specific data in a network connected to the switchgear and an apparatus for carrying out the method, which overcome the hereinafore-mentioned disadvantages of the heretofore-known methods and apparatuses of this general type and which include additional functions in the method.

With the foregoing and other objects in view there is provided, in accordance with the invention, a method for determining at least one of switchgear-specific data at contacts in switchgear or contactors and operation-specific data in a network connected to the switchgear or contactors, which comprises detecting a so-called contact follow-through travel on a switching path as an equivalent criterion for erosion; measuring a resilience change during a shutdown cycle in each case in order to determine an erosion of contact facings of contact pieces and converting the resilience change to a remaining contact life, by performing a time measurement of an armature movement from a start of the armature movement to a start of contact opening for a switchgear drive including an armature, a magnet coil and an associated yoke; determining the armature movement from the measured time, determining the resilience from the armature movement, detecting a measurement of the contact opening on a load side of the monitored switching device and signaling an armature movement start from a voltage of the magnet coil; and determining switching, operating and fault states at the switching device and in an electrical network, in addition to the resilience, from the resilience detection signals by measuring the voltages at the magnet coil of the switching device drive and at switching poles of the switching device, in particular at an artificial star point.

In accordance with another mode of the invention, there is provided a method which comprises detecting an electrically on/off operating state of the contactor drive.

In accordance with a further mode of the invention, there is provided a method which comprises detecting the number of switching operations.

In accordance with an added mode of the invention, there is provided a method which comprises detecting a phase failure or a network voltage failure.

In accordance with an additional mode of the invention, there is provided a method which comprises detecting contact welding.

In accordance with yet another mode of the invention, there is provided a method which comprises additionally deriving any short circuit present in the network from the resilience detection signals.

In accordance with yet a further mode of the invention, there is provided a method which comprises avoiding faulty evaluations in the determination of the remaining contact life of the switching contacts by the detection of the phase failure and/or the network voltage failure.

In accordance with yet an added mode of the invention, there is provided a method which comprises supplying signals for the electrical on/off contactor drive through an optocoupler to a microprocessor for further evaluation.

In accordance with yet an additional mode of the invention, there is provided a method which comprises counting the number of electrical on/off signal changes in a microprocessor.

In accordance with again another mode of the invention, there is provided a method which comprises identifying a phase failure when the contactor is connected, by using a microprocessor.

In accordance with again a further mode of the invention, there is provided a method which comprises identifying a network voltage failure with a microprocessor through a voltage divider at the artificial star point.

In accordance with again an added mode of the invention, there is provided a method which comprises identifying contact welding when the contactor is switched off and network voltage is present.

In accordance with again an additional mode of the invention, there is provided a method which comprises identifying a short circuit by using a magnetic sensor system to detect a magnetic field.

With the objects of the invention in view, there is also provided an apparatus for carrying out the method, comprising an evaluation circuit and a microprocessor for determining contact follow-through travel from time signals, the microprocessor also processing signals relating to a network state; and units actuating the microprocessor for evaluating at least one of network voltage and phase voltage, the units containing a device for detecting arc voltages, in particular at an artificial star point.

In accordance with another feature of the invention, the device for detecting the arc voltages operates without a reference-ground potential.

In accordance with a further feature of the invention, there is provided a high-pass filter associated with one of several line phases at the artificial star point. The filter may be a passive high-pass filter, an active high-pass filter or a series circuit including a passive and an active high-pass filter.

In accordance with a concomitant feature of the invention, the evaluation circuit for determining the arc voltage without a reference-ground potential has measurement lines for each line phase at the artificial star point for additional detection of phase voltages.

Within the context of the present invention, the existing electronics can be used on one hand to identify specific fault states in the remaining contact life detection and to avoid an incorrect evaluation and, on the other hand, to obtain useful data for switchgear monitoring, such as specific states of the switching device or of the electrical network connected to the switching device. This extension of function means that the further measured data can be obtained with minimum additional complexity and by using a microprocessor, which is normally already present.

The invention thus allows the detection of additional states at the switching device and/or in the electrical network by using the existing "remaining service-life electronics". These states, which can be detected without any additional technical complexity, or with only little additional technical complexity, particularly when using a contactor as the switching device, are preferably the following:

1. Detection of "electrical on/off contactor drive"
2. Number of switching operations
3. Detection of "phase failure"
4. Detection of "network voltage failure"
5. Detection of "contact welding"
6. Detection of "short circuit"

In this case, items 1, 2 and 5 relate to switchgear-specific data for the contactor which is used as a switching device, and items 3, 4 and 6 relate to operation-specific data in the network connected to the contactor.

In the event of phase failure, the voltage at the artificial or synthetic star point is not zero, but rather an alternating voltage is present with an amplitude ½ $U_{phase}$ if there are two intact phases, or 1 $U_{phase}$ if there is one intact phase. The electronic evaluation circuit for contact opening thus produces a cyclic output signal despite the closed bridge contacts from which an incorrect evaluation of the remaining contact life would normally be made due to an incorrectly determined time difference.

The latter problem is now solved since the microprocessor advantageously inhibits the evaluation of the remaining contact life when the two states "contactor connected" and "phase failure" exist at the same time. The evaluation inhibition is updated by the microprocessor at a predetermined time interval, and if the state has not changed, is continued in the next respective interval. The maximum value of the contactor disconnection time may be used as the interval length.

On the other hand, in the event of a network voltage failure, all three external conductors of the three-phase network are interrupted. In an ideal situation, the star-point voltage on the load side of the contactor would be zero, irrespective of whether the contactor is connected or disconnected. In fact, the current paths which are isolated from the network, that is to say are floating, behave like antennas, and interference voltages can be injected inductively and capacitively. The electronic evaluation circuit for contact opening reacts to this with output signals produced sporadically by the interference signals.

Once again, the microprocessor inhibits the evaluation of the remaining contact life when the two states "contactor connected" and "network voltage failure" exist at the same time. The evaluation inhibition is maintained in an analogous manner to that described above.

While, in the general case, the star-point voltage is measured with respect to a reference-ground potential, it is possible in an implementation of the apparatus that represents an inventive development, for the occurrence of a switching voltage to be detected as a voltage drop in one current path of the star-point circuit.

Other features which are considered as characteristic for the invention are set forth in the appended claims.

Although the invention is illustrated and described herein as embodied in a method for determining switchgear-specific data at contacts in switchgear and/or operation-specific data in a network connected to the switchgear and an apparatus for carrying out the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
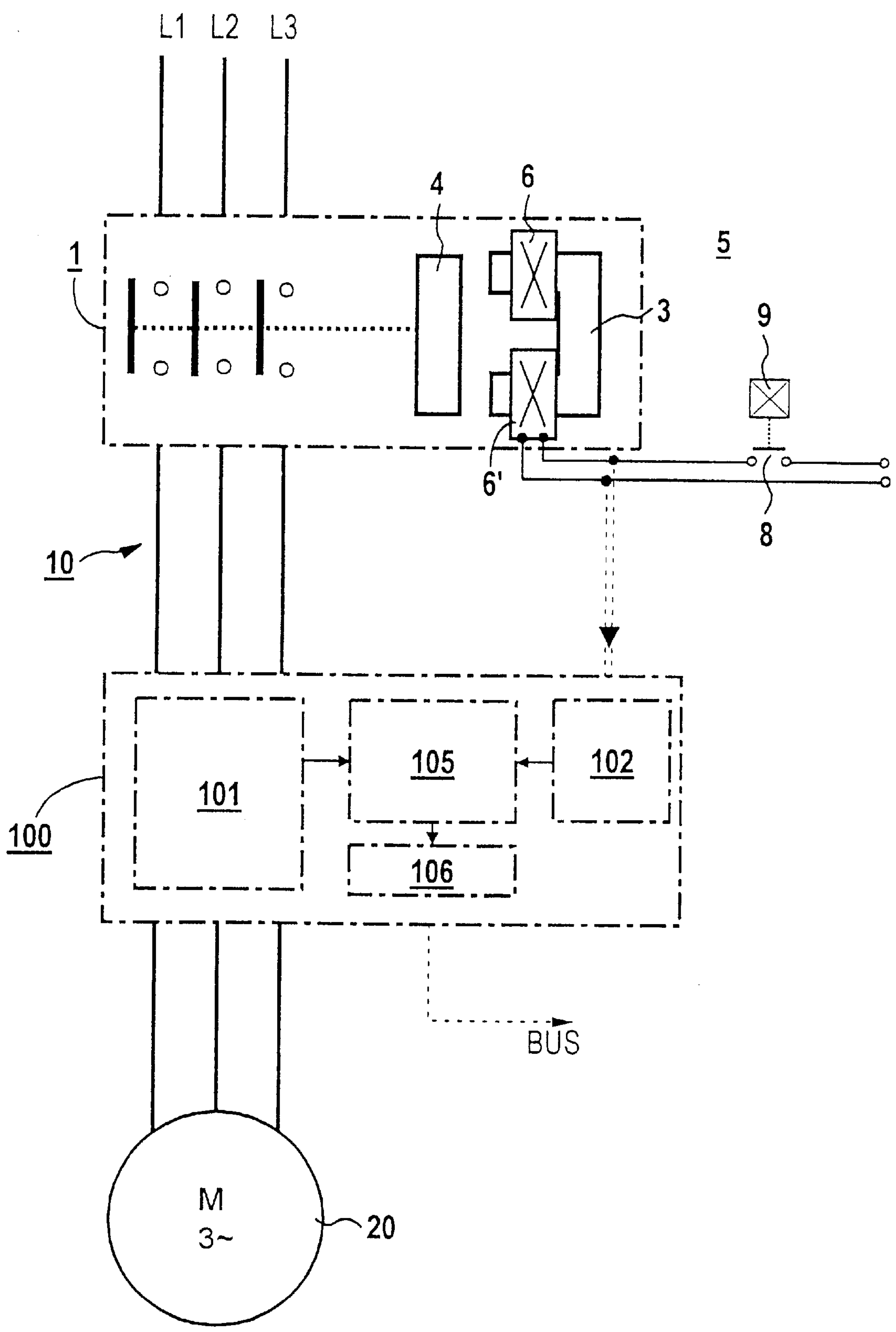
FIG. 1 is a schematic and block circuit diagram of an apparatus for the detection of a remaining contact life of contactor contacts during a shutdown cycle with simultaneous determination of operation-relevant data and states.

Referring now in detail to the figures of the drawings, in which identical elements and elements with the same effect have the same reference symbols in the individual figures and in which in some cases, the figures are described jointly, and first, particularly, to FIG. 1 thereof, there is seen a schematic illustration of a device for identifying a remaining contact life and its association with a contactor 1. An evaluation unit 100 is located on a load side 10 between the contactor 1 and an electrical load, for example a motor 20, and makes contact with external conductors L1, L2 and L3 through a first monitoring unit or module 101 for identifying contact opening. The monitoring unit 101 actuates a microprocessor 105, which determines contact follow-through travel and additional switching operation states. For this purpose, the microprocessor receives further signals for monitoring an armature opening of a contactor magnetic drive, from a unit 102. The microprocessor passes resulting data to an output unit 106 from which, if required, an output is made of all switchgear-specific data through a bus for further evaluation.

The contactor 1 has an associated contactor magnetic drive 5, which includes an armature 3 with an associated yoke 4. Contactor coils 6 and 6' are fitted on the yoke. The coils are actuated through a control switch. A voltage at the contactor magnet coils is supplied to the unit 102 for monitoring armature opening, and an armature opening signal is transmitted to the evaluation unit 100.

Through the use of the circuit described above, it is possible to use the microprocessor 105 to determine the present contact follow-through travel and, from this, the electrical contact life of the main switching pieces, from the time signals supplied by the monitoring modules. In addition, further switchgear-specific data are now also determined, which have already been referred to in the introduction. In detail, these are:

1.) Contactor Drive “Electrical On/Off”:

The electronic circuit for detecting the start of armature opening from the coil voltage produces voltage pulses at zero crossings of the sinusoidal AC voltage. These voltage pulses can be supplied to the microprocessor 105 through an optocoupler for direct evaluation or, for example, it is possible to use a retriggerable timing stage to produce a square-wave signal which, with a predetermined delay, follows the change in the switching state from on to off with the voltage change, for example from “high” to “low”. The duration of one network half-cycle may be used for the delay time.

2.) Number of Switching Operations:

For this purpose, the microprocessor 105 counts, for example, the number of signal changes from high to low of the square-wave pulses described in 1.).

Figure 2:
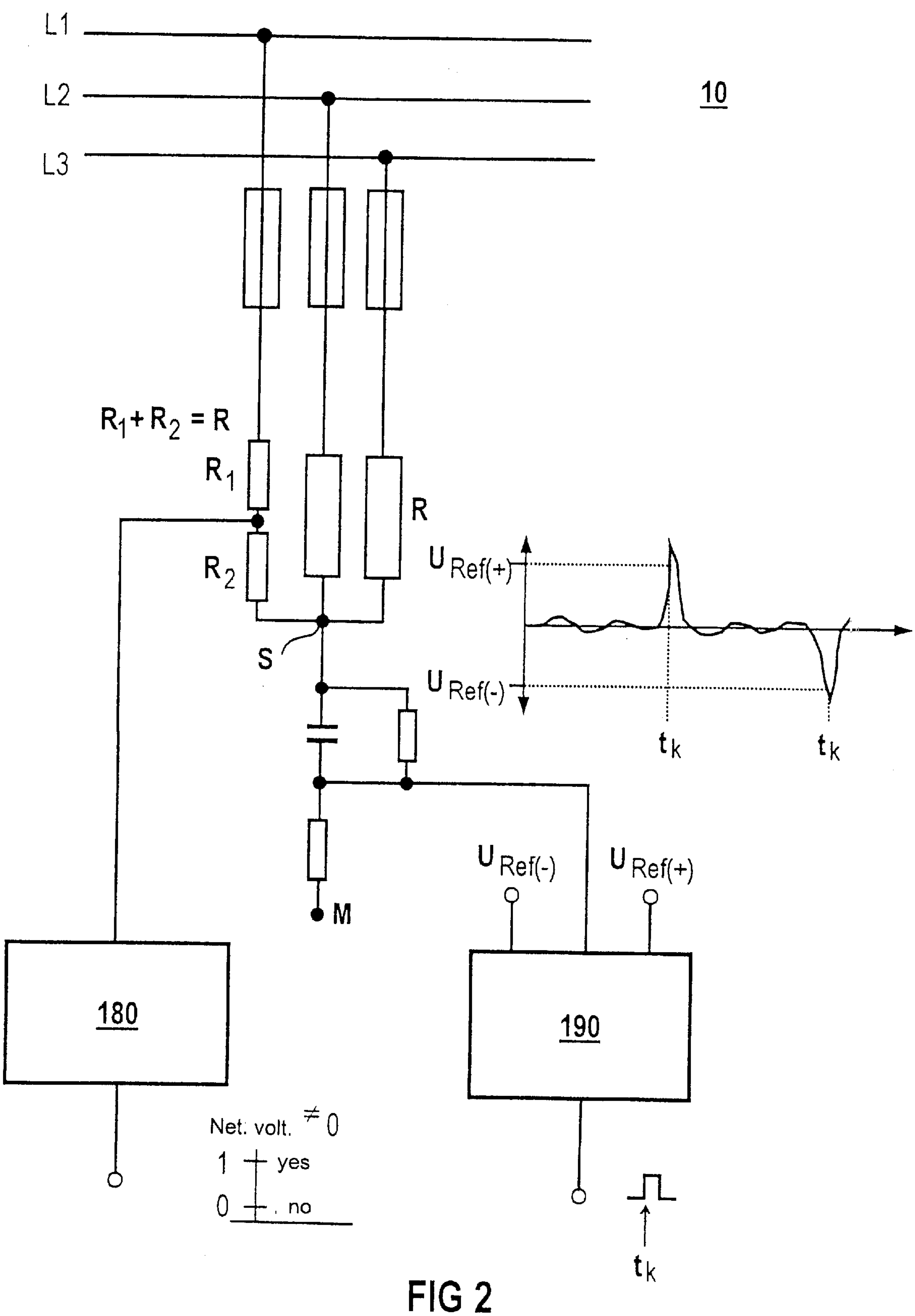
FIG. 2 is a schematic and block circuit diagram of an apparatus for the generation of an opening time $t_K$ for a first of switching contacts to open in contactors, during a shutdown cycle, in three-phase networks, and monitoring of a network voltage by voltage measurement at an artificial star point.

3.) Phase Failure:

When the contactor 1 is connected, a phase failure is detected as a cyclic star-point signal and can be identified in the evaluation circuit for contact opening as shown in FIG. 2, directly as a cyclic output signal from the microprocessor (at twice the network frequency).

4.) Network Voltage Failure:

A voltage which is proportional to the phase voltage is tapped off on a voltage divider in an artificial star-point circuit, which is connected between a load-side measurement connection of an external conductor and a measurement ground, and is processed further as a digital signal.

If no such voltage is measured when the contactor is connected, and the microprocessor does not identify a phase failure either, then a network voltage failure is indicated as a result.

5.) Contact Welding:

Contact welding can be identified when the contactor is disconnected and the network voltage is present.

The extreme case of three-pole welding is identified from “contactor drive electrically off” and “no network voltage failure” states.

Single-pole or two-pole welding is identified as such when the two states “contactor drive electrically off” and “phase failure” occur together. Welding on one side of a switching link cannot be measured when the contactor is disconnected, since the relevant switching path still provides electrical isolation. However, when the contactor is connected, there is a high probability that this bridge contact will produce a phase failure on the load side. Thus, when a “phase failure” fault message is produced, additional information is required as to the two possible causes “discontinuity in an external conductor—or—contact switching pole open”.

6.) Short Circuit:

Current transformers, such as those used in an overload relay, may be used for short-circuit identification. As an alternative, a magnetic sensor system is used, for example, which makes it possible to detect that a predetermined current threshold has been exceeded. In addition to Hall-effect sensors or magnetoresistive sensors, low-cost inductive sensors may also be used. The sensors are disposed in a directly isolated manner on the main current paths, in order to ensure that the measured magnetic field is dominant and the influence of magnetic fields from adjacent switchgear which carry short circuits can be ignored.

In principle, the short-circuit identification by the microprocessor is linked to the contactor connected state. If a short circuit is recorded, the microprocessor may emit an additional warning message, in order to check the contactor contacts for welding. In particular, the contactor could be disconnected in a controlled manner in order to carry out a welding test. In order to do this, the control phase of the contactor drive may be switched off briefly, or permanently in the event of a long-lasting short circuit, through a break contact controlled by the microprocessor.

FIG. 2 shows an embodiment example of a circuit for generating a time signal $t_K$ for the start of contact opening of main contacts, which are subject to the most severe erosion. The essential feature of this circuit is to measure the contact voltages (arc voltage) of a three-pole switching device in the three-phase network at an artificial star point S. In addition to circuits described above, an upgraded evaluation unit 180 is now provided, for detecting the network voltage and for detecting the star-point voltage. This makes it possible, on one hand, to determine the time $t_K$ for first-opening switching contacts during a shutdown cycle and, on the other hand, to monitor the network voltage at the same time.

In corresponding extensions of the invention relating to the prior art described above, it is possible, as shown in FIG. 3, to detect the remaining contact life by using an integrated magnetic sensor system, for short-circuit detection. In this case, an overload relay having an integrated unit 200 for remaining service-life detection is connected between the contactor 1 and a location upstream of the motor 20. The integrated unit 200 has units 201, 202 and 205 corresponding to the units 101, 102 and 105 in FIG. 1. Furthermore, in FIG. 3, there is a module 220 for monitoring short circuits. The monitoring module 220 is actuated by magnetic sensors 221, 222, 223 associated with the individual lines.

Figure 3:
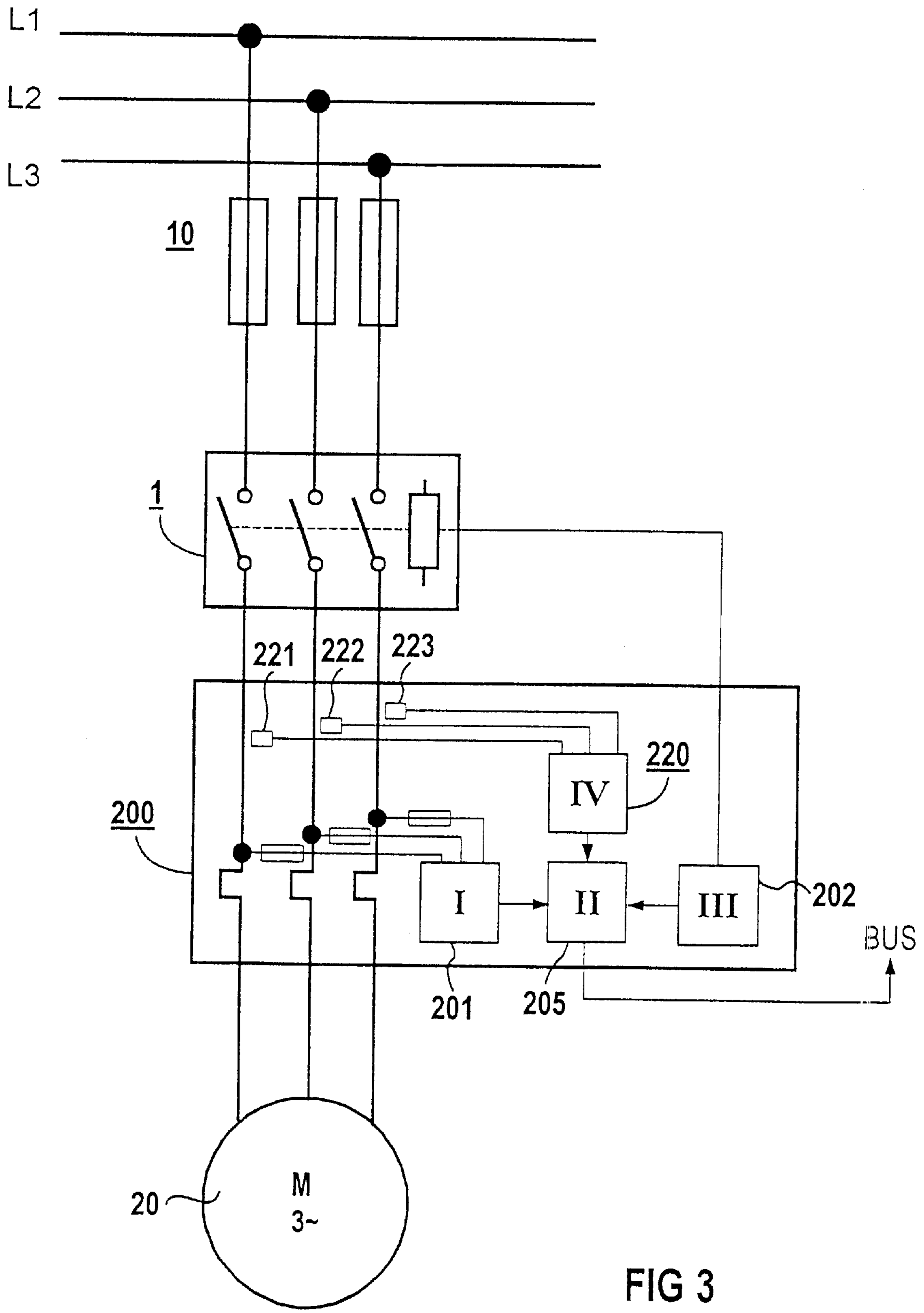
FIG. 3 is a schematic and block circuit diagram of an example of an apparatus for remaining service-life detection, using an integrated magnetic sensor system.

A table which is displayed below and is entitled “Evaluation by logic operations on the detected signals” shows, in a self-explanatory manner, that, through the use of logic operations on the signals detected in detail in FIGS. 1 to 3, it is furthermore possible to indicate switchgear-specific states in addition to detecting contact erosion through the use of resilience monitoring. The essential feature in this case is that it is very largely possible to use the same structure for the evaluation circuits.

Until now, circuitry using R-C elements has been precluded for detecting the start of armature opening from coil voltage, since it leads to a coil voltage having a profile which cannot be evaluated. Varistors or zener diodes are noted as alternatives.

It has been found that varistors limit overvoltages only to about 1.75-times the value of their rated operating voltage. Suppressor diodes having a current/voltage characteristic which has a sharp kink have been found to be more advantageous. It is advantageous that the suppressor diodes, in the same way as varistors, do not consume any electrical power in normal operation. A further circuitry option is represented by a capacitor which is connected through a bridge rectifier to a positive output and a negative output and has a high-value resistor connected in parallel with it for discharging. When the contactor coil is connected, the capacitor is charged to a peak voltage of the control phase, and briefly increases its voltage when damping an overvoltage. When the contactor coil is disconnected, the capacitor is discharged through a parallel resistor (power loss=$\hat{U}_{Net}^2$/R).

In freewheeling circuits for preventing overvoltages when switching DC-operated contactor drives, armature openings can be detected from the current profile. However, it appears to be virtually impossible to evaluate the precise armature opening time since the characteristic signal profile is broadened in time by a factor of 5 in comparison with a coil voltage signal which can be evaluated. If the freewheeling diode in the freewheeling circuit is replaced by a microprocessor-controlled freewheeling transistor with a zener diode connected back-to-back with it for switching-voltage limiting, the contactor disconnection delay can be shortened, and a coil-voltage signal can be produced which can be evaluated.

In FIG. 2, the switching voltage timing signal required for this purpose was generated at the first-opening main switching pieces by measuring a difference voltage between a fixed reference-ground potential, such as zero potential or ground potential, and a potential at an artificial star point on the load side of the monitored contactor. However, in certain applications, neither a neutral conductor nor a protective-ground conductor is available in a switchgear assembly. The GR 97 P 3558 possibility of forming a fixed reference-ground potential in this case on the supply side of the contactor through the use of a further artificial star point would involve additional technical complexity. As an alternative illustrated in FIGS. 4 and 5, the start of contact opening can be detected without using a zero or ground potential.

Figure 4:
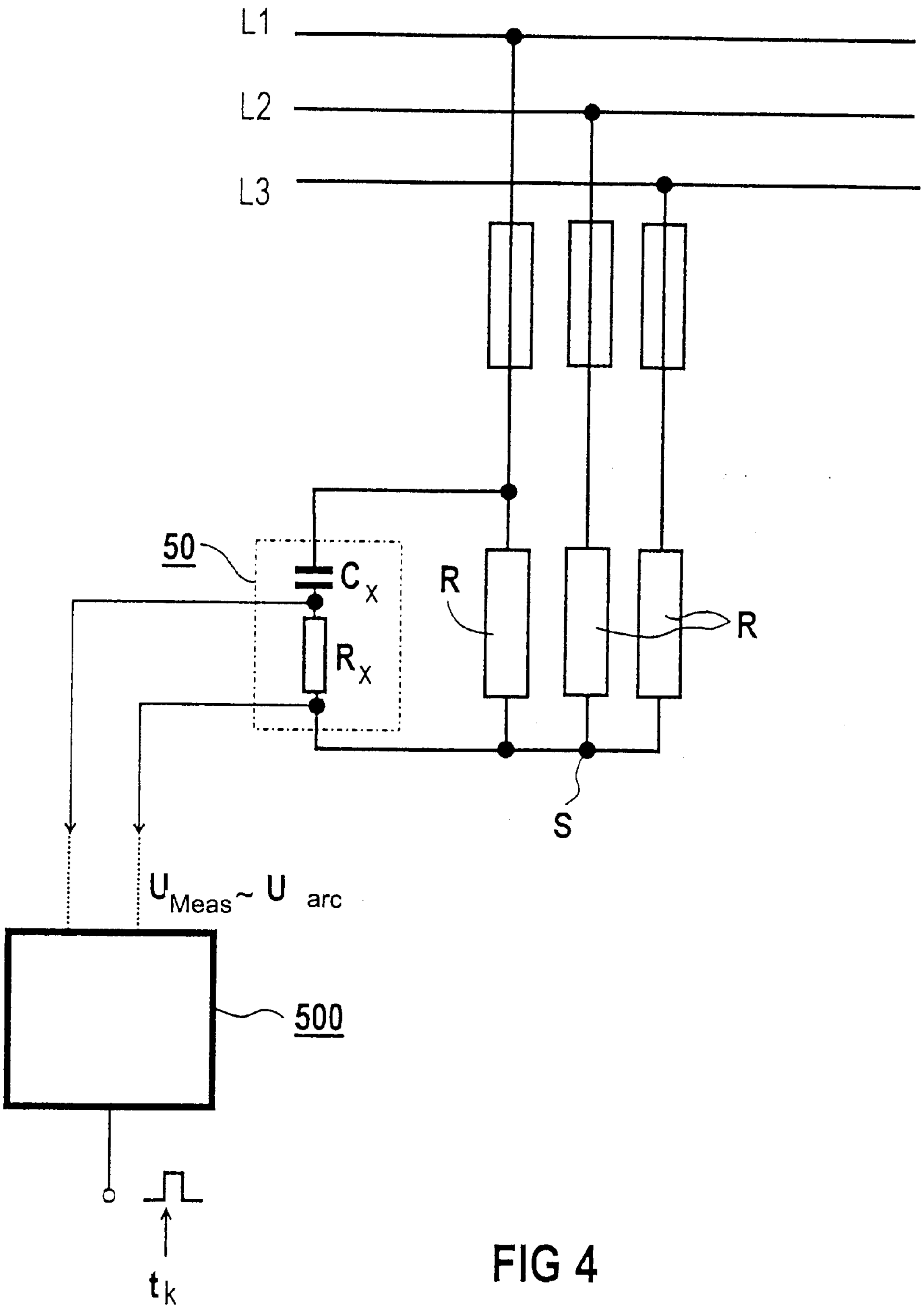
FIG. 4 is a schematic and block circuit diagram of an apparatus for the detection of a contact opening at the artificial star point without using any further reference-ground potential.

According to FIG. 4, an occurrence of a switching voltage is detected as a voltage drop in a current path of the star-point circuit. The measured voltage is processed further by using a high-pass filter, and provides an output voltage proportional to the switching voltage. If a predetermined threshold value is exceeded, this can produce the desired control signal for the first start of contact opening in the normal way.

| Evaluation by logic operations on the detected signals | | | | | | | |
|---|---|---|---|---|---|---|---|
| Star-point voltage | any | any | zero | ≠ zero | zero | ≠ zero | any |
| Network voltage | any | any | zero | any | ≠ zero | any | any |
| Voltage at the magnet coil | ≠ zero | zero | ≠ zero | ≠ zero | zero | zero | ≠ zero |
| Magnetic sensor system | | | | | | | Induct. B> threshold value |
| Evaluation | electrically "on" | electrically "off" | network failure | phase failure | 3-pole welded | 1 or 2-pole welded | short circuit |

The switching voltages (arc voltage) are described by the following equations:

$$U_1+U_2+U_3=0,\ I_1+I_2+I_3=0$$

$$U_1-U_{STP}=R*I_1+L*d/dt(I_1)+U_{B1}$$
$$U_2-U_{STP}=R*I_2+L*d/dt(I_2)+U_{B2}$$
$$U_3-U_{STP}=R*I_3+L*d/dt(I_3)+U_{B3}$$
$$\Sigma\colon\ U_{STP}=-(U_{B1}+U_{B2}+U_{B3})/3,$$

where $U_{(1,2,3,)}$=phase voltages, $U_{STP}$=star-point voltage, $I_{(1,2,3)}$=phase currents, $U_{B(1,2,3)}$=arc voltages, R=resistive load, and L=inductive load.

In order for the first switching pole to open, $U_{B2}$ and $U_{B3}$, for example are zero, thus giving:

$$U_{STP}=-U_{B1}/3.$$

When substituted in the above equations, two possible measurements on a current path of the star-point circuit are obtained for L=0, U:=$U_{1,2,3}$ and I:=$I_{1,2,3}$ $$R*I=U-\tfrac{2}{3}U_B$$

$$R*I=U+\tfrac{1}{3}U_B$$

In FIG. 4, reference numeral 50 denotes a passive high-pass filter with a capacitance $C_x$ and a resistance $R_x$, through which a unit 500 is actuated in order to determine the contact-opening time. The time $t_K$ is thus determined precisely without there being any need for a reference-ground potential, such as a zero potential or ground potential. In order to detect the arc voltage element, an interfering 50 Hz network voltage element is eliminated by using the high-pass filter 50 (for example f(−3 dB)=5 . . . 10 kHz).

In order to provide a structure corresponding to FIG. 4 with a passive high-pass filter, measurements for a sudden 16V voltage change, which corresponds to the switching voltage immediately after contact separation of a contactor bridge contact, give a useful signal having an amplitude of about 1V with a residual signal from the interference network voltage (220 V AC) likewise having an amplitude of about 1V. The interference network voltage element can be reduced to a negligible value through the use of an active high-pass filter, possibly of a higher order.

In order to better suppress the network voltage elements in the measurement voltage, it is thus possible to use an active high-pass filter of a higher order, or a series circuit including a passive and an active high-pass filter, instead of the passive high-pass filter 50 shown in FIG. 4. The series circuit including the passive high-pass filter 50 allows the amplitude of the input voltage to the active high-pass filter to be limited to acceptable values.

Figure 5:
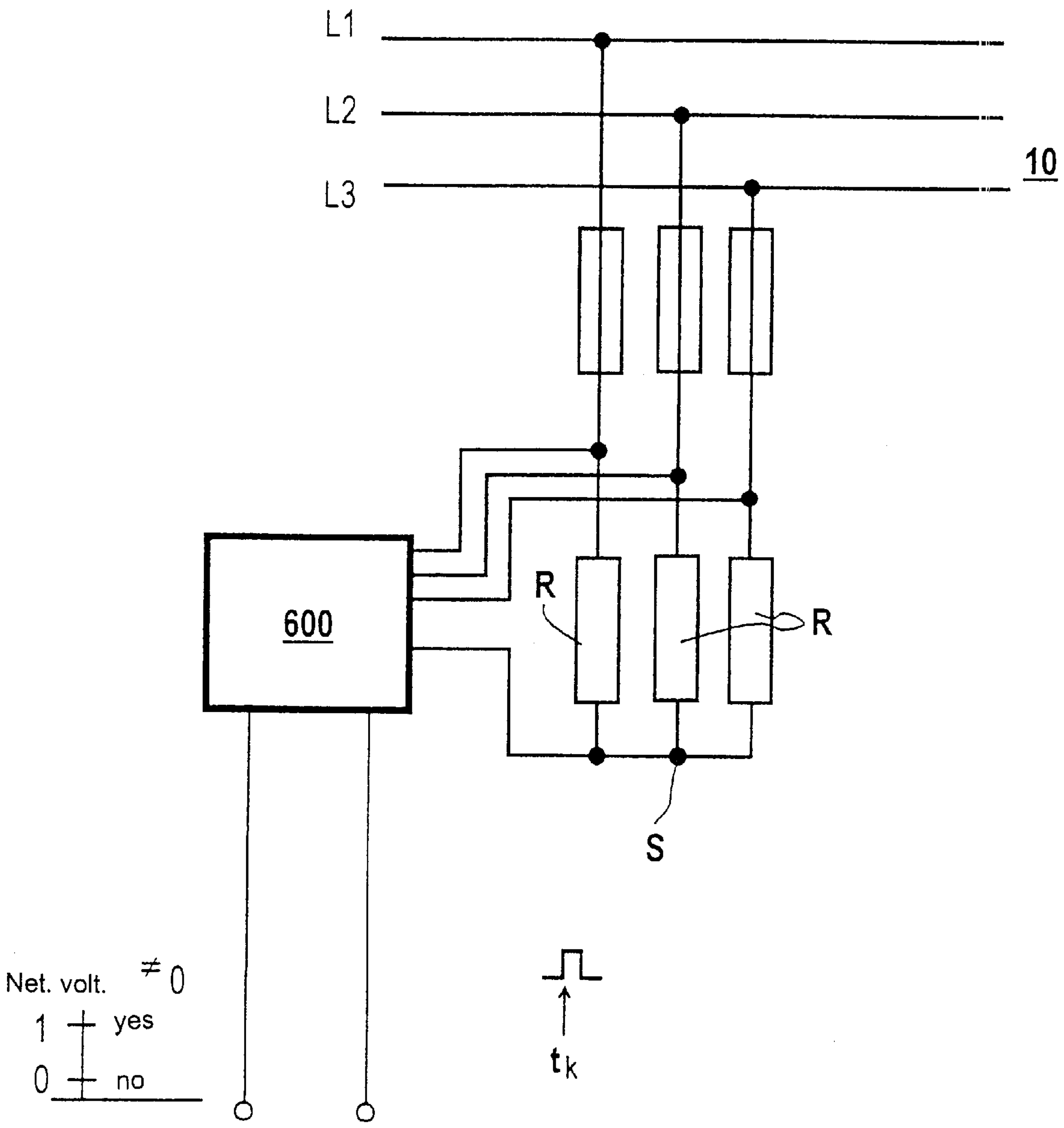
FIG. 5 is a schematic and block circuit diagram of an apparatus for evaluation for detection of phase voltages on current paths at the artificial star point as shown in FIG. 4.

The circuit shown in FIG. 4 is modified in FIG. 5 in such a way that an evaluation unit 600 is connected directly to one phase of the artificial star-point circuit and simultaneously monitors contact opening and the network voltage. A further measurement line is connected from each of the other two phases to the evaluation unit, in order to monitor their phase voltage. In this case, the evaluation unit 600 contains passive and/or active high-pass filters for detecting the switching voltage of the first-opening switching contact, as well as an electronic circuit for detecting the phase voltages of the monitored circuits.

While the monitoring of contactor contacts has essentially been described with reference to the figures, the statements below apply to remaining service-life detection at power breakers:

During an operational shutdown cycle, mechanical energy from a spring-energy storage device is converted into kinetic energy in moving switching-mechanism components and the moving contacts, as well as into friction work.

The conversion of mechanical energy to kinetic energy governs a movement sequence and thus a time required from the start of the disconnection operation of the switching mechanism until the start of contact opening.

As a result of contact erosion, the position of the moving contact carrier with respect to the fixed contact carrier changes both in the connected state and at the instant of contact separation. Thus, in a corresponding manner, there is a change in the position of the switching-mechanism components which are coupled to the moving contact carrier. These switching-mechanism components include, for example, a switching shaft on which the moving contact carrier is mounted, or a lever mechanism for force transmission to the switching shaft and/or to the moving contacts.

The movement (linear and/or rotational movement) of the switching-mechanism components is, in general, a movement with a non-uniform acceleration. As is shown by the following, simple examples, the contact erosion causes a time shift $\Delta t$ in the contact-opening time in the direction of shorter times:

1.) Accelerated movement with a constant acceleration b

Delay times $t_1$, $t_2$, delay-time difference $\Delta t=t_1-t_2$ $t_1$=opening time when the contacts are new $t_2$=opening time of the contacts with material erosion Distances $s_1$, $s_2$, distance difference $\Delta s=s_1-s_2$ $\Delta s$=position change due to erosion, for example change in the thickness of contact facings $v_1$=constant governed by the structure, for example the speed of the monitored-position switching-mechanism components at the contact opening time $$s_1=½b*t_1^2, s_2=½b*t_2^2, \Delta s=½b*(t_1^2-t_2^2)=½b*(2t_1-\Delta t)*\Delta t$$

where $v_1=b*t_1$ it follows that $\Delta s=(v_1-½b*\Delta t)*\Delta t$

2.) Uniform movement at a constant speed $V_1$ $$s_1=V_1*t_1, s_2=v_1*t_2, \Delta s=v_1*\Delta t$$

In the case of values of $\Delta t<<t_1, t_2$, it can thus be assumed, approximately, for the movement with non-uniform acceleration during an actual shutdown cycle, that $\Delta s \sim \Delta t$ and $\Delta s=v_1*\Delta t$, using the constant $v_1$ governed by the structure.

In the following text, the contact follow-through travel is denoted by reference symbol s, with the new state governed by the structure being given the value $s_{new}$, and a minimum resilience at an end of the contact life being $s_{min}$.

A delay-time measurement gives delay times $t_{new}$, t and $t_{min}$ associated with the contact follow-through travel values $s_{new}$, s, $s_{min}$, and these can be used to introduce a fictional speed $v_1$, where:

$$s_{new}-s=\Delta s=v_1*\Delta t(s)$$

and $$s_{new}-s_{min}=\Delta s_{max}=v_1*\Delta t_{max}$$

The maximum permissible contact erosion $\Delta s_{max}$ thus corresponds to a maximum shift $\Delta t_{max}$ of the contact opening time toward shorter delay times.

In order to obtain the time shift $\Delta t$ of the contact opening time, delay times having an end time which is equated to the contact opening time are measured. The initial time is chosen to be that time at which a selected component of the switching mechanism reaches a predetermined position during the shutdown cycle. This additionally results in short-circuit disconnections, in which the contacts are opened due to current forces even before the predetermined switching-mechanism position is reached, not being used for evaluation of the contact erosion. Faulty evaluation of the contact erosion in the event of short-circuit disconnections is thus avoided.

The structural characteristics of the switching mechanism govern, in detail, the method for generating the initial time for the delay-time measurement. In order to achieve a stable connection and disconnection position in electromechanical power breakers, the switching mechanism is generally constructed to operate by using a rocker-arm mechanism, in which the lever mechanism has to move through a dead-center position when changing position. The predetermined switching-mechanism position for detecting an initial time for the delay-time measurement is thus defined as the switching-mechanism position at which the lever mechanism is located between the dead-center position and the limit position in the disconnected position.

In order to achieve sufficient accuracy in the determination of contact erosion and remaining contact life, it is necessary to detect the switching-mechanism position that characterizes the initial time to an accuracy of not more than 0.1 mm. Since the speed of the monitored-position switching-mechanism components at the initial time of the delay-time measurement is less than at the end time, an inaccuracy in the erosion detection of >0.1 mm can be expected for a position inaccuracy of 0.1 mm.

It is virtually impossible to achieve the required accurate position detection by using field-dependent position sensors such as inductive or capacitive movement sensors, which operate without making contact. Optical sensors are subject to the problem of contamination, for example due to erosion and are thus not particularly suitable for position detection in the switching device. An electromechanical auxiliary contact, on which the switching-mechanism component to be monitored acts, is proposed as a simple, robust device for position detection. The fixed contact in this auxiliary contact device governs the position at which the monitored switching-mechanism component strikes the associated moving contact. This should allow reproducible position detection to not more than 0.1 mm, without major complexity.

When the switching device is new, or the switching contacts are new, the delay time $t_{new}$ is detected during the shutdown cycle, and is stored in a suitable, non-volatile data memory. As the contact erosion increases, the delay time t is shortened to a value $t_{min}$, which corresponds to the maximum permissible erosion $\Delta s_{max}$. The parameter $\Delta t_{max}$ ($=t_{new}-t_{min}$) which is governed by the structure and represents the maximum permissible reduction in the delay time, is used by a microprocessor to determine the remaining contact life (for example as a percentage):

$$Rld[\%]=(1-(\text{delay time}(t_{new})-\text{delay time}(t))/\Delta t_{max})*100.$$

For simplicity, the above equation assumes a linear relationship between the position change due to contact erosion and the delay-time change. If, for structural reasons, the profile of the resilience change differs significantly from the profile of the delay-time change, then the fictional speed $v_1$ changes with the amount of contact erosion. This can be taken into account approximately by forming $v_1$ by linear interpolation from values $v_1'$ governed by the structure when new and $v_1''$ at the end of the contact life:

$$v_1=v_1'*(\Delta t_{max}-\Delta t)/\ \Delta t_{max}+v_1''*\Delta t/\Delta t_{max},$$

where $\Delta t=\text{delay time}(t_{new})-\text{delay time}(t)$

This results in the following conditional equation for the remaining contact life, as a percentage:

$$Rld[\%]=(1-\Delta t*v_1/\Delta s_{max})*100$$

the latter equation can be evaluated by using the existing microprocessor, so that the values can be displayed on-line.

We claim:

1. A method for determining at least one of switchgear-specific data at contacts in switchgear or contactors and operation-specific data in a network connected to the switchgear or contactors, which comprises:

detecting a contact follow-through travel on a switching path as an equivalent criterion for erosion;

measuring a resilience change during a shutdown cycle in each case in order to determine an erosion of contact facings of contact pieces and converting the resilience change to a remaining contact life, by performing a time measurement of an armature movement from a start of the armature movement to a start of contact opening for a monitored switchgear including a magnetic drive with an armature, a magnet coil and an associated yoke;

determining a path of the armature movement from the measured time, determining the resilience from the armature using a measured-value acquisition of a start of the contact opening on a load side of the monitored switchgear and signaling an armature movement start from a voltage of the magnet coil; and determining switching, operating and fault states at the switchgear drive and in an electrical network, in addition to the contact follow-through travel, from the resilience detection signals by measuring the voltages at the magnet coil of the switching device drive and at switching poles of the switchgear drive.

2. The method according to claim 1, which comprises carrying out the step of measuring the voltages at an artificial star point.

3. The method according to claim 1, which comprises detecting an electrically on/off operating state of the switchgear drive.

4. The method according to claim 3, which comprises supplying signals for the electrical on/off contactor drive through an optocoupler to a microprocessor for further evaluation.

5. The method according to claim 1, which comprises detecting the number of switching operations.

6. The method according to claim 5, which comprises counting the number of electrical on/off signal changes in a microprocessor.

7. The method according to claim 1, which comprises detecting a phase failure.

8. The method according to claim 7, which comprises identifying a phase failure when the contactor is connected, by using a microprocessor.

9. The method according to claim 1, which comprises detecting a network voltage failure.

10. The method according to claim 9, which comprises identifying a network voltage failure with a microprocessor through a voltage divider at an artificial star point.

11. The method according to claim 1, which comprises detecting contact welding.

12. The method according to claim 11, which comprises identifying contact welding when the contactor is switched off and network voltage is present.

13. The method according to claim 1, which comprises additionally deriving any short circuit present in the network from the contact follow-through travel detection signals.

14. The method according to claim 13, which comprises identifying a short circuit by using a magnetic sensor system to detect a magnetic field.

15. The method according to claim 1, which comprises detecting a phase failure and a network voltage failure, and avoiding faulty evaluations in the determination of the remaining service life of the switching contacts by the detection of at least one of the phase failure and the network voltage failure.

16. An apparatus for carrying out the method according to claim 1, comprising:

an evaluation circuit and a microprocessor for determining contact follow-through travel from time signals, said microprocessor also processing signals relating to a network state; and units actuating said microprocessor for evaluating at least one of network voltage and phase voltage, said units containing a device for detecting arc voltages.

17. The apparatus according to claim 16, wherein the arc voltages are detected at an artificial star point.

18. The apparatus according to claim 16, wherein said device for detecting the arc voltages operates without a reference-ground potential.

19. The apparatus according to claim 17, including a high-pass filter associated with one of several line phases at said artificial star point.

20. The apparatus according to claim 19, wherein said filter is a passive high-pass filter.

21. The apparatus according to claim 19, wherein said filter is an active high-pass filter.

22. The apparatus according to claim 19, wherein said filter is a series circuit including a passive and an active high-pass filter.

23. The apparatus according to claim 19, wherein said device for detecting the arc voltages operates without a reference-ground potential, and said evaluation circuit for determining the arc voltage without a reference-ground potential has measurement lines for each line phase at said artificial star point for additional detection of phase voltages.

* * * * *